US008958185B2

(12) United States Patent
Tsai et al.

(10) Patent No.: US 8,958,185 B2
(45) Date of Patent: Feb. 17, 2015

(54) ESD BLOCK ISOLATION BY RF CHOKE

(75) Inventors: Ming Hsien Tsai, Sindian (TW);
Jun-De Jin, Hsinchu (TW);
Hsieh-Hung Hsieh, Taipei (TW);
Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 530 days.

(21) Appl. No.: 13/029,240

(22) Filed: Feb. 17, 2011

(65) Prior Publication Data
US 2012/0212865 A1    Aug. 23, 2012

(51) Int. Cl.
| H02H 9/00 | (2006.01) |
| H01L 27/02 | (2006.01) |
| H02H 9/04 | (2006.01) |
| H01C 7/12 | (2006.01) |
| H02H 1/00 | (2006.01) |
| H02H 1/04 | (2006.01) |
| H02H 3/22 | (2006.01) |
| H02H 9/06 | (2006.01) |

(52) U.S. Cl.
CPC .......... *H01L 27/0288* (2013.01); *H02H 9/046* (2013.01)
USPC ............................................. 361/56; 361/118

(58) Field of Classification Search
USPC ........................................................ 361/56
See application file for complete search history.

(56) References Cited

U.S. PATENT DOCUMENTS

| 6,044,110 A  * | 3/2000 | Yiu ................................. 375/229 |
| 6,861,680 B2 | 3/2005 | Ker et al. |
| 7,023,678 B2 | 4/2006 | Ker et al. |
| 7,564,664 B2 * | 7/2009 | Knapp et al. ..................... 361/56 |
| 2004/0080881 A1 * | 4/2004 | Chou ............................... 361/56 |

FOREIGN PATENT DOCUMENTS

CN          101442205 A       5/2009

OTHER PUBLICATIONS

Tsai, M.H. et al., "A Wideband Low Noise Amplifier with 4 kV HBM ESD Protection in 65 nm RF CMOS", IEEE Microwave and Wireless Components Letters, Nov. 2009, 19(11):734-736.
Chen, G. et al., "Characterizing Diodes for RF EDS Protection", IEEE Electron Device Letters, May 2004, 25(5):323-325.
Lin, C.Y. et al., "Self-Matched ESD Cell in CMOS Technology for 60-GHz Broadband RF Applications", IEEE Radio Frequency Integrated Circuits Symposium, 2010, RTUIF-20, pp. 573-576.
Official Action issued Jan. 3, 2014 in counterpart Chinese Patent Application.

* cited by examiner

*Primary Examiner* — Dharti Patel
(74) *Attorney, Agent, or Firm* — Duane Morris LLP

(57) ABSTRACT

A circuit includes a first node configured to receive a radio frequency ("RF") signal, a first electrostatic discharge (ESD) protection circuit coupled to a first voltage supply rail for an RF circuit and to a second node, and a second ESD protection circuit coupled to the second node and to a second voltage supply node for the RF circuit. An RF choke circuit is coupled to the second node and to a third node disposed between the first node and the RF circuit.

17 Claims, 5 Drawing Sheets

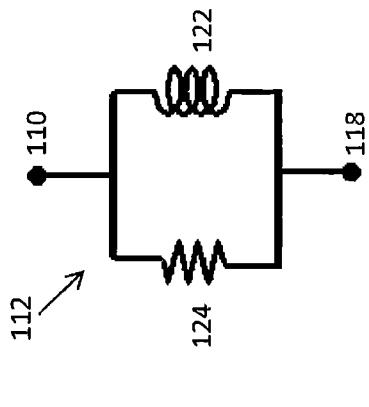
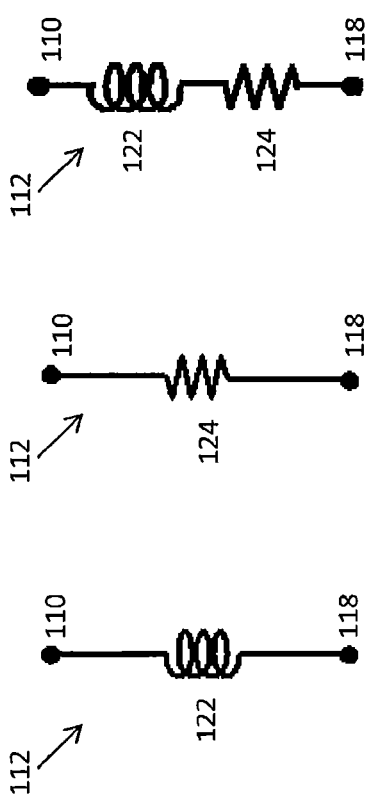
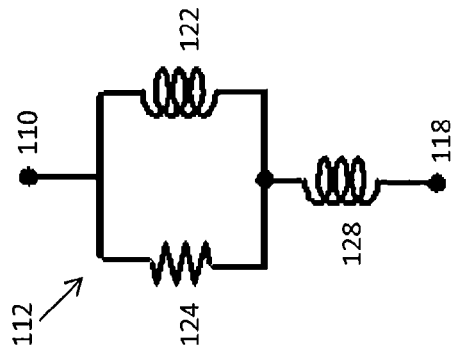
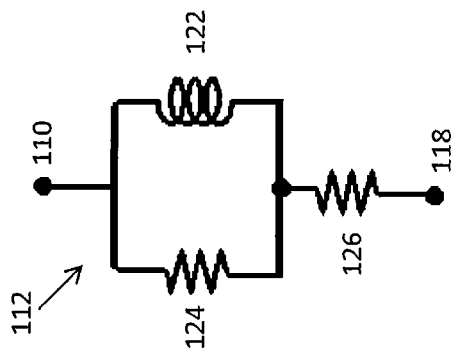

122, 128

138
122, 128

130
132
122, 128

136
134
122, 128

US 8,958,185 B2

ESD BLOCK ISOLATION BY RF CHOKE

FIELD OF DISCLOSURE

The disclosed circuit and method relate to integrated circuits. More particularly, the disclosed system and method relate to electrostatic discharge ("ESD") protection for integrated circuits.

BACKGROUND

With the continued miniaturization of integrated circuit ("IC") devices, the current trend is to produce integrated circuits having shallower junction depths, thinner gate oxides, lightly-doped drain ("LDD") structures, shallow trench isolation ("STI") structures, and self-aligned silicide ("salicide") processes, all of which are used in advanced sub-quarter-micron complementary metal oxide semiconductor ("CMOS") technologies. All of these processes cause the related CMOS IC products to become more susceptible to damage due to ESD events. Therefore, ESD protection circuits are built onto the chip to protect the devices and circuits on the IC from ESD damage.

ESD protection is especially challenging for radio frequency ("RF") ICs in view of the reduced gate oxide thicknesses and lowered breakdown voltages in the devices of the RF ICs. These conventional ESD devices typically degrade the performance of RF circuits.

BRIEF DESCRIPTION OF THE DRAWINGS

FIGS. 2A-2F illustrate various embodiments of a radio frequency choke circuit in accordance with the radio frequency circuit with improved protection from electrostatic discharge illustrated in FIG. 1.

DETAILED DESCRIPTION

Figure 1A:
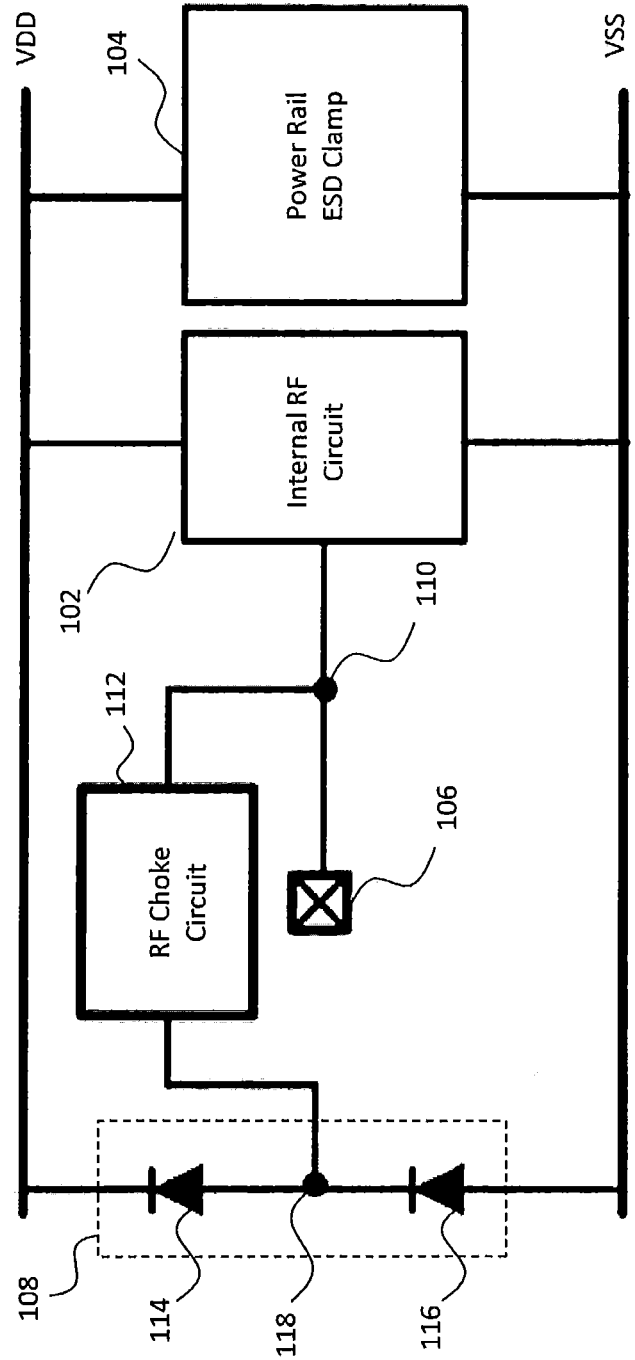
FIG. 1A illustrates one example of a radio frequency circuit including improved protection from electrostatic discharge.

The disclosed circuits and methods for electrostatic discharge ("ESD") protection includes a radio frequency ("RF") choke that advantageously reduces the noise of the RF circuit while providing protection from damage caused by ESD events. As shown in FIG. 1A, an internal RF circuit 102 is supplied by power rails VDD and VSS. A power rail ESD clamp circuit 104 is coupled in parallel with the RF circuit 102 between power rails VDD and VSS.

RF circuit 102, which in some embodiments is a low noise amplifier ("LNA"), receives an RF signal from input node 106. A diode string 108 is coupled to node 110, which is disposed between input node 106 and RF circuit 102, through an RF choke circuit 112. Diode string 108 includes first and second diodes 114, 116 that are coupled together and to RF choke circuit 112 at node 118. Diode 116 has its anode coupled to low voltage supply rail VSS and is cathode coupled to node 118 and to the anode of diode 114, which has its cathode coupled to high voltage supply rail VDD.

Figure 1B:
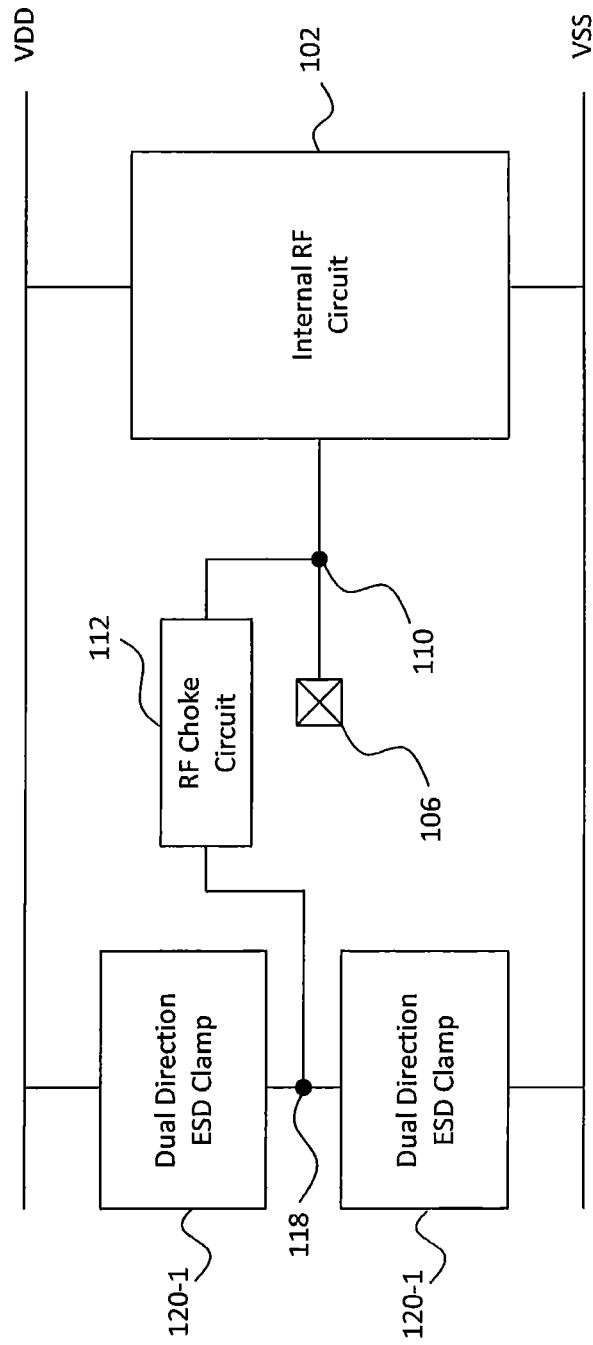
FIG. 1B illustrates another example of a radio frequency circuit including improved protection from electrostatic discharge.

FIG. 1B illustrates another example of an RF choke circuit 112 coupled to node 110 disposed between an internal RF circuit 102 and input node 106 and to node 118 disposed between a pair of dual direction ESD clamps 120-1, 120-2 (collective referred to as "ESD clamps 120" or "dual direction ESD clamps 120"). Dual direction ESD clamps 120 enable power rail ESD clamp 104 to be eliminated. Examples of ESD clamps 120 include, but are not limited to, a pair of source-bulk connected NMOS devices formed back-to-back to each other such as the dual direction ESD clamp disclosed in U.S. Pat. No. 7,639,464 issued to Vashchenko et al., which patent is incorporated by reference in its entirety. In some embodiments, the dual direction ESD clamps could be dual back-to-back diodes or dual-directional silicon-controlled rectifiers ("SCR") as will be understood by one skilled in the art.

RF choke circuit 112 may have one of a plurality of configurations. For example, FIGS. 2A-2F illustrate various examples of a choke circuit 112. As shown in FIG. 2A, choke circuit 112 may include an inductor 122 disposed between nodes 110 and 118. In some embodiments, choke circuit 112 includes a resistor 124 disposed between nodes 110 and 118 as illustrated in FIG. 2B. The size of the resistor 124 is selected to provide a high impedance at RF frequencies to provide an RF choke. In some embodiments, resistor 124 is selected to be approximately 1 k$\Omega$ or more, although one skilled in the art will understand that resistor 124 may have other resistance values.

RF choke circuit 112 may also include both an inductor 122 and a resistor 124 as in series and/or in parallel with another. For example, FIG. 2C illustrates inductor 122 and resistor 124 coupled together in series between nodes 110 and 118. FIG. 2D illustrates an RF choke circuit 112 in which inductor 122 and resistor 124 are coupled in parallel with each other between nodes 110 and 118. As illustrated in FIGS. 2E and 2F, a second resistor 126 and/or inductor 128 may be coupled in series with the parallel combination of inductor 120 and resistor 122.

Figure 3B:
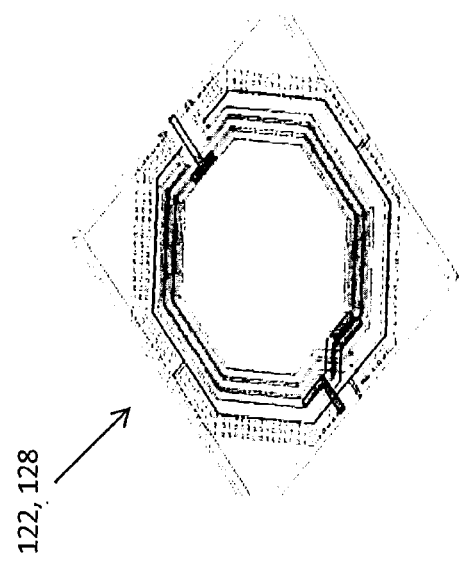
FIGS. 3A-3D illustrate several embodiments of an inductor that may be implemented in the radio frequency choke circuit in accordance with FIGS. 1A and 1B.
Figure 3D:
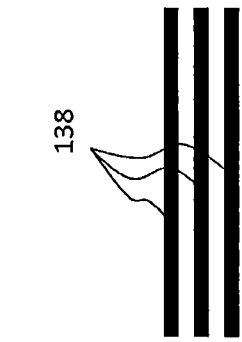
Figure 3A:
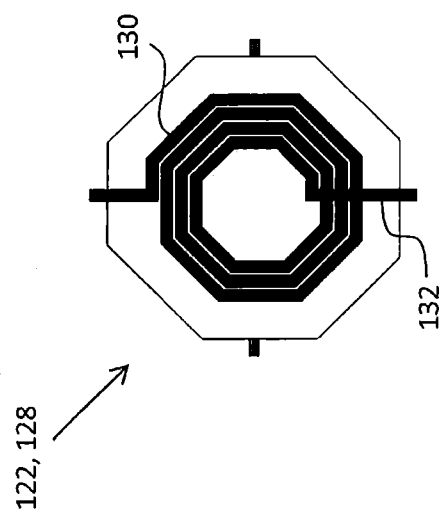
Figure 3C:
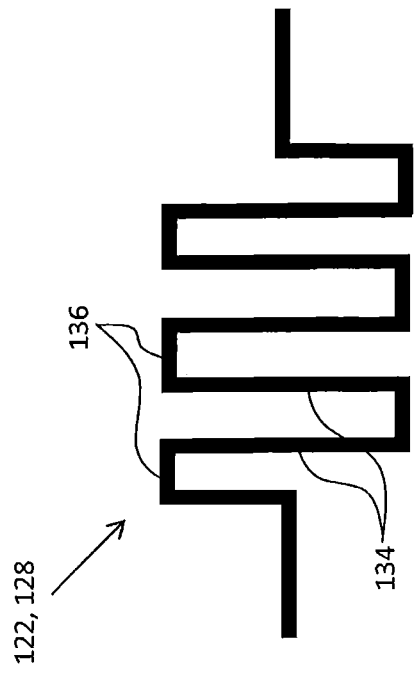

FIGS. 3A-3D illustrate various types of inductors that may be implemented as inductors 122, 128 in RF choke circuit 112. As shown in FIG. 3A, inductor 122, 128 may be a planar coil 130 formed in a single metal layer with a central tap 132 disposed on a second metal layer above or below the first metal layer. In some embodiments, inductor 122, 128 is in the form of a transformer comprising first and second coils formed in either the same metal layer or adjacent metal layers. FIG. 3C illustrates an embodiment of inductor 122, 128 in which the inductor includes a metal line having a linearly coiled shape comprising a plurality of parallel segments 134 coupled together by perpendicular segments 136. In some embodiments, such as the embodiment illustrated in FIG. 3D, inductor 122, 128 may be a linear inductor comprising a plurality of parallel metal lines 138.

Figure 4:
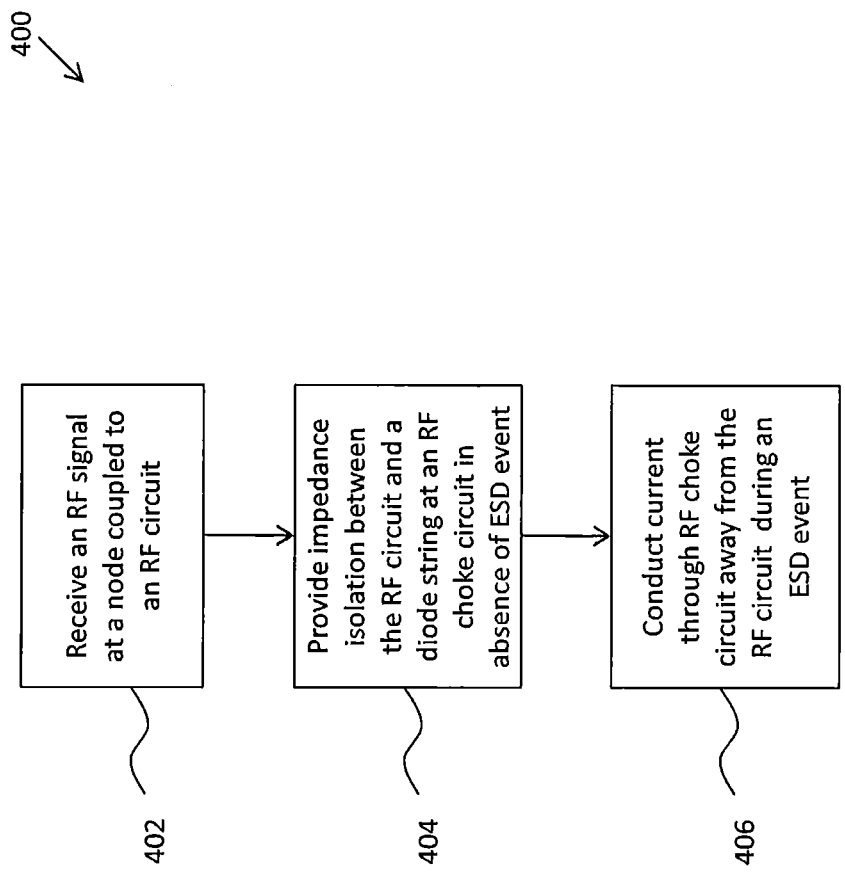
FIG. 4 is a flow diagram of one example of a method of operation of the radio frequency circuit with improved protection from electrostatic discharge.

The operation of RF choke circuit 112 is described with reference to FIGS. 1, 2, and 4 in which FIG. 4 is a flow diagram of one example of a method 400 of providing protection from ESD events. As shown in FIG. 4, an RF signal is received at node 106, which is coupled to RF circuit 102 through node 110, at block 302.

During normal high frequency operation (e.g., frequencies at or above approximately 15 GHz) at block 304, RF choke circuit 112 behaves as an open circuit providing impedance isolation between node 110 and 118. With RF choke circuit 112 effectively operating as an open circuit, power of the incoming RF signal received at node 106 is not lost between node 106 and internal RF circuit 102. Unlike conventional ESD protection circuits that utilize LC tanks that resonate at certain frequencies and thus have narrowband operation, RF choke circuit 112 does not resonate at certain frequencies such that it provides ESD protection over a wideband without affecting the RF signal as it propagates from node 106 to internal RF circuit 102.

At block 306, RF choke circuit 112 behaves as a short circuit between node 110 and 118 during an ESD event between node 106 and either the first or second voltage supply rails set at VDD or VSS. RF choke circuit 112 functioning as a short circuit between nodes 110 and 118 during an ESD event creates a conduit for high current generated by the ESD event to be channeled away from RF circuit 102 to node 118 where the current is then directed to one of the voltage supply rails set at VDD or VSS.

In some embodiments, a circuit includes a first node configured to receive a radio frequency ("RF") signal, a first electrostatic discharge (ESD) protection circuit coupled to a first voltage supply rail for an RF circuit and to a second node, and a second ESD protection circuit coupled to the second node and to a second voltage supply node for the RF circuit. An RF choke circuit is coupled to the second node and to a third node disposed between the first node and the RF circuit.

In some embodiments, a method includes receiving a radio frequency signal at a first node coupled to a first circuit and to an RF choke circuit. The RF choke circuit is coupled to a second node disposed between a first ESD protection circuit and a second ESD protection circuit. Impedance isolation is provided between the first circuit and the second node disposed between the first and second ESD protection circuits in the absence of an electrostatic discharge event. Current is conducted through the RF choke circuit from the first node to the second node discharge current through at least one of the first and second ESD protection circuits during an electrostatic discharge event.

In some embodiments, a circuit for protecting a radio frequency ("RF") circuit from electrostatic discharge ("ESD") includes a diode string and an RF choke circuit. The diode string includes a first diode having an anode coupled to a first voltage supply line for the RF circuit and a cathode coupled to a first node. A second diode has a cathode coupled to the first node and an anode coupled to a second voltage supply line for the RF circuit. The RF choke circuit is coupled to the first node and to a second node disposed between the RF circuit and a third node through which the RF circuit receives an RF signal. The RF choke circuit is configured to provide impedance isolation between the diode string and the RF circuit in the absence of an ESD event and to conduct current from the third node to the first node during an ESD event.

The circuits disclosed herein advantageously provide a direct channel between an input node for receiving a RF signal and the internal RF circuit, such as an LNA, which results in lower power loss. Additionally, the inclusion of an RF choke circuit between an ESD protection circuit and a node disposed along a transmission path between an input node and an internal RF circuit demonstrates improved noise performance and supports wideband operation for high frequency (e.g., 15 GHz and beyond) operation compared to alternative circuits that utilize one or more LC tanks that resonate and have narrowband operation.

Although the circuit and method have been described in terms of exemplary embodiments, they are not limited thereto. Rather, the appended claims should be construed broadly, to include other variants and embodiments of the circuit and method, which may be made by those skilled in the art without departing from the scope and range of equivalents of the circuit and method.

What is claimed is:

1. A circuit, comprising:
a first node configured to receive a radio frequency ("RF") signal;
a first electrostatic discharge (ESD) protection circuit coupled to a first voltage supply rail for an RF circuit and to a second node;
a second ESD protection circuit coupled to the second node and to a second voltage supply rail for the RF circuit; and
an RF choke circuit disposed in parallel with the first node and coupled to the second node and to a third node disposed between the first node and the RF circuit,
wherein the RF choke circuit has substantially no capacitance and includes an inductor.

2. The circuit of claim 1, wherein the first ESD protection circuit includes a first diode having an anode coupled to the first voltage supply rail and a cathode coupled to the second node, the second ESD protection circuit includes a second diode having a cathode coupled to the second voltage supply rail and an anode coupled to the second node.

3. The circuit of claim 1, wherein the RF choke circuit includes a first resistor coupled in parallel with a first inductor.

4. The circuit of claim 3, further comprising a second resistor disposed in series with the first resistor and the first inductor that are disposed in parallel with each other.

5. The circuit of claim 4, further comprising a second inductor disposed in series with the first resistor and the first inductor that are disposed in parallel with each other.

6. The circuit of claim 1, further comprising a third ESD circuit coupled to the first and second supply rails in parallel to the RF circuit.

7. The circuit of claim 1, further comprising a third ESD protection circuit disposed in parallel with the RF circuit and coupled to the first and second voltage supply rails.

8. A method, comprising:
receiving a radio frequency signal at a first node coupled to a first circuit and to an RF choke circuit, the RF choke circuit coupled to a second node disposed between a first ESD protection circuit and a second ESD protection circuit;
providing impedance isolation between the first circuit and the second node disposed between the first and second ESD protection circuits in the absence of an electrostatic discharge event; and
conducting current through the RF choke circuit from the first node to the second node discharge current through at least one of the first and second ESD protection circuits during an electrostatic discharge event,
wherein the RF choke circuit includes a first resistor disposed in parallel with a first inductor.

9. The method of claim 8, wherein the RF choke circuit includes a first resistor disposed in parallel with a first inductor.

10. The method of claim 9, wherein the RF choke circuit includes a second resistor disposed in series with the first resistor and the first inductor that are disposed in parallel with each other.

11. The method of claim 9, wherein the RF choke circuit includes a second inductor disposed in series with the first resistor and the first inductor that are disposed in parallel with each other.

12. A circuit for protecting a radio frequency ("RF") circuit from electrostatic discharge ("ESD"), the circuit comprising:

a diode string including
- a first diode having an anode coupled to a first voltage supply line for the RF circuit and a cathode coupled to a first node, and
- a second diode having a cathode coupled to the first node and an anode coupled to a second voltage supply line for the RF circuit; and an RF choke circuit coupled to the first node and to a second node disposed between the RF circuit and a third node through which the RF circuit receives an RF signal, the RF choke circuit configured to provide impedance isolation between the diode string and the RF circuit in the absence of an ESD event and to conduct current from the third node to the first node during an ESD event, wherein the RF choke circuit has substantially no capacitance and includes an inductor.

13. The circuit of claim 12, wherein the RF choke circuit includes an inductor and a resistor.

14. The circuit of claim 13, wherein the inductor and resistor are disposed in series with each other.

15. The circuit of claim 13, wherein the inductor and resistor are disposed in parallel with each other.

16. The circuit of claim 13, wherein the RF choke circuit includes a second resistor coupled in series with a parallel combination of the resistor and inductor.

17. The circuit of claim 13, wherein the RF choke circuit includes a second inductor coupled in series with a parallel combination of the resistor and inductor.

* * * * *